United States Patent
Park

(10) Patent No.: US 10,634,952 B2
(45) Date of Patent: Apr. 28, 2020

(54) BACKLIGHT UNIT AND LIQUID CRYSTAL DISPLAY DEVICE INCLUDING THE SAME

(71) Applicant: LG Display Co., Ltd., Seoul (KR)

(72) Inventor: Ki-Duck Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 145 days.

(21) Appl. No.: 15/435,565

(22) Filed: Feb. 17, 2017

(65) Prior Publication Data

US 2018/0239079 A1 Aug. 23, 2018

(51) Int. Cl.
*F21V 8/00* (2006.01)
*G02F 1/13357* (2006.01)
(Continued)

(52) U.S. Cl.
CPC ..... *G02F 1/133621* (2013.01); *G02B 6/0023* (2013.01); *G02B 6/0068* (2013.01); *G02F 1/133603* (2013.01); *B32B 2457/20* (2013.01); *B32B 2457/202* (2013.01); *B32B 2457/206* (2013.01); *G02B 5/22* (2013.01); *G02B 6/00* (2013.01); *G02B 6/005* (2013.01); *G02B 6/009* (2013.01); *G02B 6/0055* (2013.01); *G02F 1/133615* (2013.01); *G02F 2001/133614* (2013.01); *G02F 2001/133624* (2013.01);
(Continued)

(58) Field of Classification Search
CPC ........ G02B 6/00; G02B 6/005; G02B 6/0055; G02B 6/0073; G02B 6/009; G02B 5/22; G02B 6/0023; G02B 6/0068; G02F 1/133603; G02F 1/133621; G02F 1/133615; G02F 2001/133614; G02F 2001/133624; H01L 33/504; H01L 33/507; H01L 2251/53; H01L 2251/5369; H01L 2251/50; H01L 51/50; H01L 51/5012; H01L 51/502; H01L 31/035209; H01L 33/44; H01L 33/486; H01L 33/501; H01L 25/0753; Y10T 428/1036; Y10T 428/1041; B32B 2457/20; B32B 2457/202; B32B 2457/206
See application file for complete search history.

(56) References Cited

U.S. PATENT DOCUMENTS

2014/0168572 A1* 6/2014 Iwata ................. H01L 51/5268
349/61
2015/0014728 A1* 1/2015 Do ...................... C09K 11/565
257/98
(Continued)

FOREIGN PATENT DOCUMENTS

JP         2002040233 A  *  2/2002
JP         2012084512 A  *  4/2012
KR       20140082203 A  *  7/2014    ....... G02F 1/133514

*Primary Examiner* — Eli D. Strah
(74) *Attorney, Agent, or Firm* — Morgan, Lewis & Bockius LLP

(57) ABSTRACT

A liquid crystal display device, includes a liquid crystal panel; and a backlight unit under the liquid crystal panel and having a light source. The light source includes a first luminous material having a first peak wavelength, a second luminous material having a second peak wavelength greater than the first peak wavelength, a third luminous material having a third peak wavelength greater than the second peak wavelength, and a light absorption material having an absorption maximum at a wavelength between the second peak wavelength and the third peak wavelength.

17 Claims, 10 Drawing Sheets

(51) Int. Cl.
  *G02B 6/00* (2006.01)
  *H01L 31/0352* (2006.01)
  *H01L 51/50* (2006.01)
  *G02B 5/22* (2006.01)
  *H01L 33/50* (2010.01)
  *H01L 33/44* (2010.01)
  *H01L 25/075* (2006.01)
  *H01L 33/48* (2010.01)

(52) U.S. Cl.
  CPC .. *H01L 25/0753* (2013.01); *H01L 31/035209* (2013.01); *H01L 33/44* (2013.01); *H01L 33/486* (2013.01); *H01L 33/501* (2013.01); *H01L 33/504* (2013.01); *H01L 33/507* (2013.01); *H01L 51/50* (2013.01); *H01L 51/502* (2013.01); *H01L 51/5012* (2013.01); *H01L 2251/50* (2013.01); *H01L 2251/53* (2013.01); *H01L 2251/5369* (2013.01); *Y10T 428/1036* (2015.01); *Y10T 428/1041* (2015.01)

(56) References Cited

U.S. PATENT DOCUMENTS

2016/0005933 A1* 1/2016 Chang ............... H01L 33/52
  257/98
2017/0059932 A1* 3/2017 Hong ................ G02B 6/0073

* cited by examiner

BACKLIGHT UNIT AND LIQUID CRYSTAL DISPLAY DEVICE INCLUDING THE SAME

BACKGROUND

Field of the Disclosure

The present disclosure relates to a liquid crystal display device, and more particularly, to a backlight unit and a liquid crystal display device including the same that have a light absorption material absorbing light at a specific wavelength and a wide color gamut.

Discussion of the Related Art

A liquid crystal display (LCD) device includes two substrates and a liquid crystal layer between the two substrates and transmits light by controlling an arrangement of liquid crystal molecules of the liquid crystal layer, thereby displaying an image.

In general, the LCD device includes a plurality of pixels arranged in a matrix, and each pixel includes a thin film transistor, a pixel electrode, and a common electrode. Voltages are applied to the pixel electrode and the common electrode of each pixel, and an electric field is generated between the pixel electrode and the common electrode. The liquid crystal molecules of the liquid crystal layer are rearranged by the generated electric field, and the transmittance of the liquid crystal layer is changed. Therefore, by adjusting the voltages applied to the pixel electrode and the common electrode of the LCD device, the transmittance of the liquid crystal layer of each pixel can be controlled to produce a value corresponding to an image signal. As a result, the LCD device displays an image.

The LCD device is not self-luminous, and thus, additional light should be provided to the LCD device. Accordingly, the LCD device may include a liquid crystal panel to display the image and a backlight unit to provide light to the liquid crystal panel.

The backlight unit includes a light source. A fluorescent lamp, such as a cold cathode fluorescent lamp (CCFL) or an external electrode fluorescent lamp (EEFL), has been used for the light source.

The backlight unit is classified as a direct-type or an edge-type depending on the path of light emitted from the light source. In a direct-type backlight unit, a plurality of lamps is disposed under the liquid crystal panel, and light emitted from the lamp is directly provided to the liquid crystal panel. In an edge-type backlight unit, a light guide plate is disposed under the liquid crystal panel and a lamp is disposed at at least one side of the light guide plate. Then, light emitted from the lamp is refracted and reflected by the light guide plate and is indirectly provided to the liquid crystal panel.

Recently, in accordance with the need for a thin and light weight LCD device, a light emitting diode (LED) lamp has replaced the fluorescent lamp because of its advantages in power consumption, weight, and brightness.

FIG. 1 is a cross-sectional view of an LCD device including an edge-type backlight unit according to the related art.

In FIG. 1, the related art LCD device includes a liquid crystal panel 10, a backlight unit 20, a main frame 30, a top frame 40, and a bottom frame 50.

The liquid crystal panel 10 includes a lower substrate 12 and an upper substrate 14, and a liquid crystal layer (not shown) is disposed between the substrates 12 and 14. A lower polarizer 18 is disposed under the lower substrate 12, and an upper polarizer 19 is disposed over the upper substrate 14.

A driving unit (not shown) comprising driver integrated circuits (driver ICs) is connected to a side of the liquid crystal panel 10 and provides signals to a plurality of pixels (not shown) in the liquid crystal panel 10.

The backlight unit 20 is disposed under the liquid crystal panel 10 and includes a reflective sheet 22, a light guide plate 24, and an optical sheet 26 sequentially placed from the bottom. Meanwhile, a light emitting diode (LED) assembly 28 is disposed at a side of the light guide plate 24 as a light source. The LED assembly 28 includes an LED printed circuit board 28a and an LED package 28b.

The main frame 30 surrounds sides of the liquid crystal panel 10 and the backlight unit 20. The main frame 30 constitutes a module with the top frame 40 at a front side of the liquid crystal panel 10 and the bottom frame 50 at a rear side of the backlight unit 20.

Because the related art LCD device has a relatively low color gamut, the related art LCD device does not express more varied colors, and it is difficult to display a high-quality image.

FIG. 2 is a view illustrating the color gamut of a related art LCD device in a CIE (International Commission on Illumination) 1976 chromaticity diagram. FIG. 2 also shows the DCI (digital cinema initiative) color standard.

Generally, to attain a wide color gamut, an overlap ratio of the color gamut of a display device to the DCI color standard should be more than 95%. However, as shown in FIG. 2, the color gamut NCG of the related art LCD device has a smaller area than the DCI color standard, and the overlap ratio is about 81.0%. Therefore, it is difficult to provide an LCD device according to the related art with a relatively wide color gamut.

SUMMARY

Accordingly, the present invention is directed to a backlight unit and an LCD device comprising the same that substantially obviate one or more of the problems due to limitations and disadvantages of the related art.

An object of the present disclosure is to provide an LCD device having a wide color gamut.

Another object of the present invention is to provide an LCD device that can be easily manufactured with low cost and a flexible degree of design.

Another object of the present invention is to provide an LCD device with improved heat resistance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a liquid crystal display device comprises a liquid crystal panel; and a backlight unit under the liquid crystal panel and having a light source including: a first luminous material having a first peak wavelength, a second luminous material having a second peak wavelength greater than the first peak wavelength, a third luminous material having a third peak wavelength greater than the second peak wavelength, and a light absorption material having an absorption maximum at a wavelength between the second peak wavelength and the third peak wavelength.

In another aspect, a backlight unit comprises a light source, and an optical sheet over the light source, wherein the light source includes: a first luminous material having a first peak wavelength, a second luminous material having a second peak wavelength greater than the first peak wavelength, a third luminous material having a third peak wavelength greater than the second peak wavelength, and a light absorption material having an absorption maximum at a wavelength between the second peak wavelength and the third peak wavelength.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and which are incorporated in and constitute a part of this specification, illustrate embodiments of the invention and together with the description serve to explain the principles of the invention. In the drawings.

DETAILED DESCRIPTION

Reference will now be made in detail to embodiments of the disclosure, examples of which are illustrated in the accompanying drawings.

First Embodiment

Figure 1:
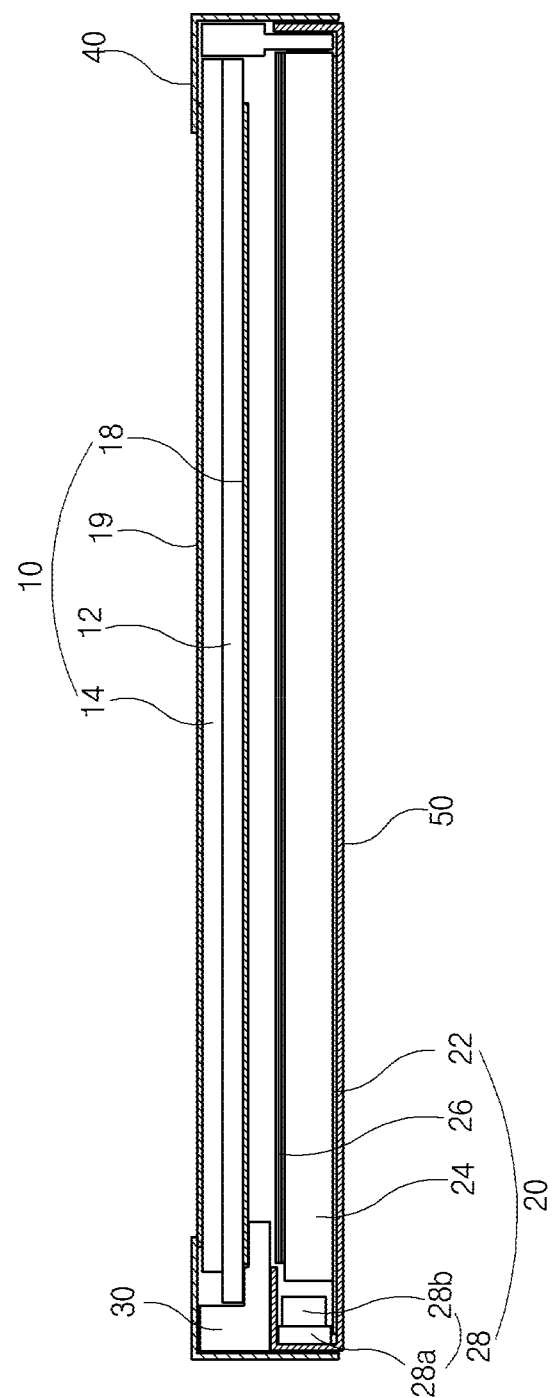
FIG. 1 is a cross-sectional view of an LCD device including an edge-type backlight unit according to the related art.
Figure 2:
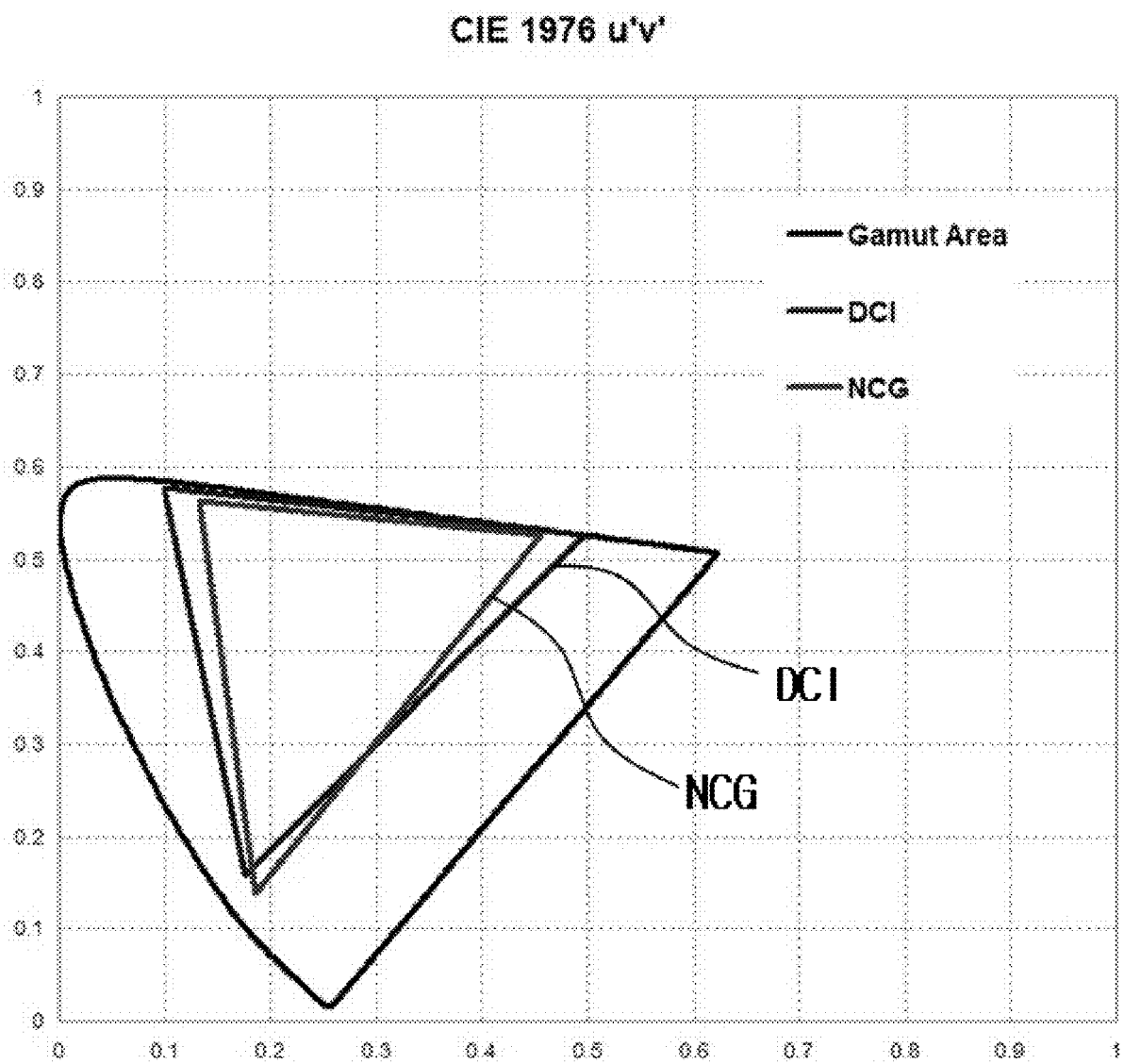
FIG. 2 is a view illustrating the color gamut of a related art LCD device in a CIE 1976 chromaticity diagram.
Figure 3:
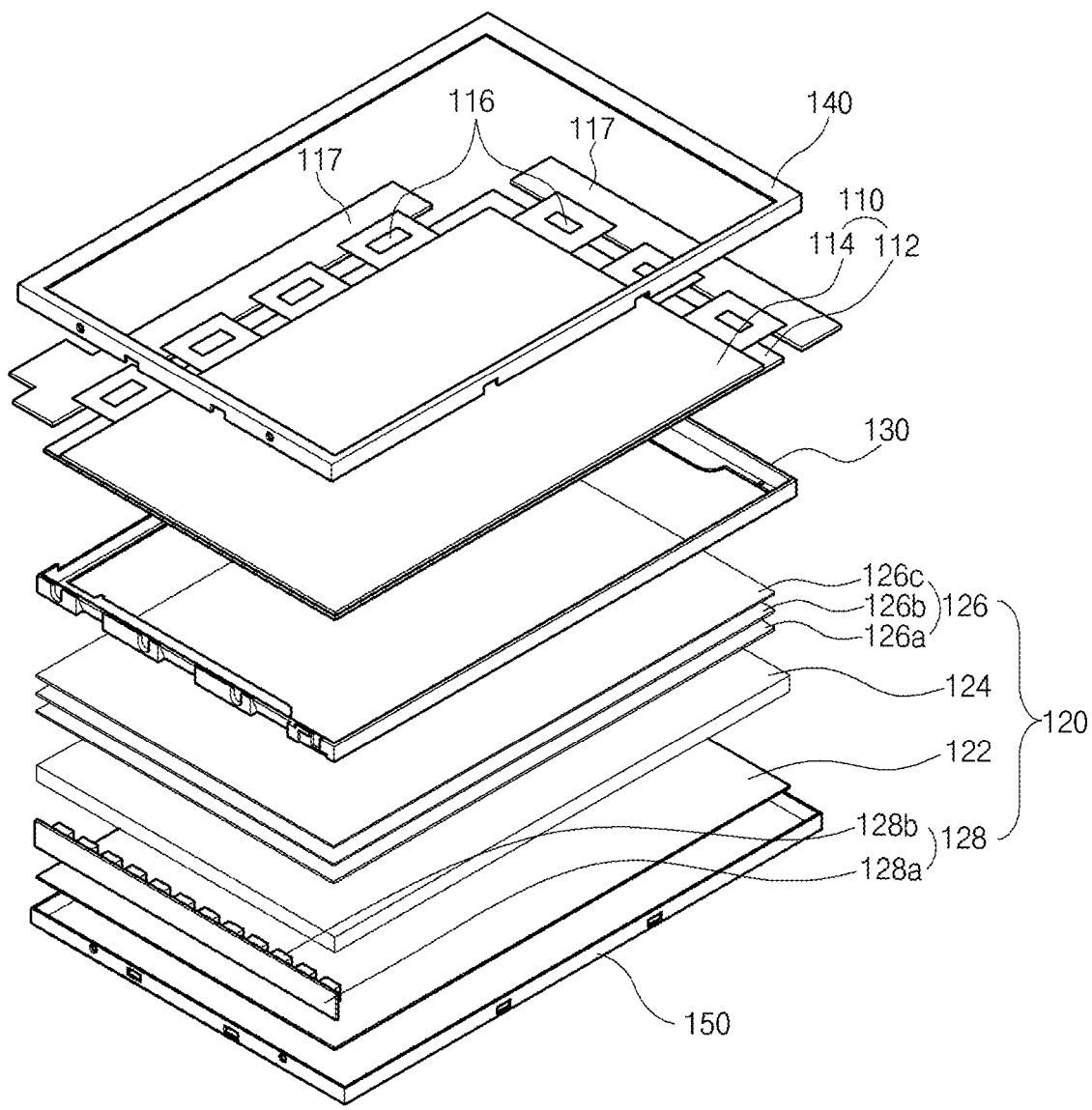
FIG. 3 is a perspective view of an LCD device according to a first embodiment of the present invention.
Figure 4:
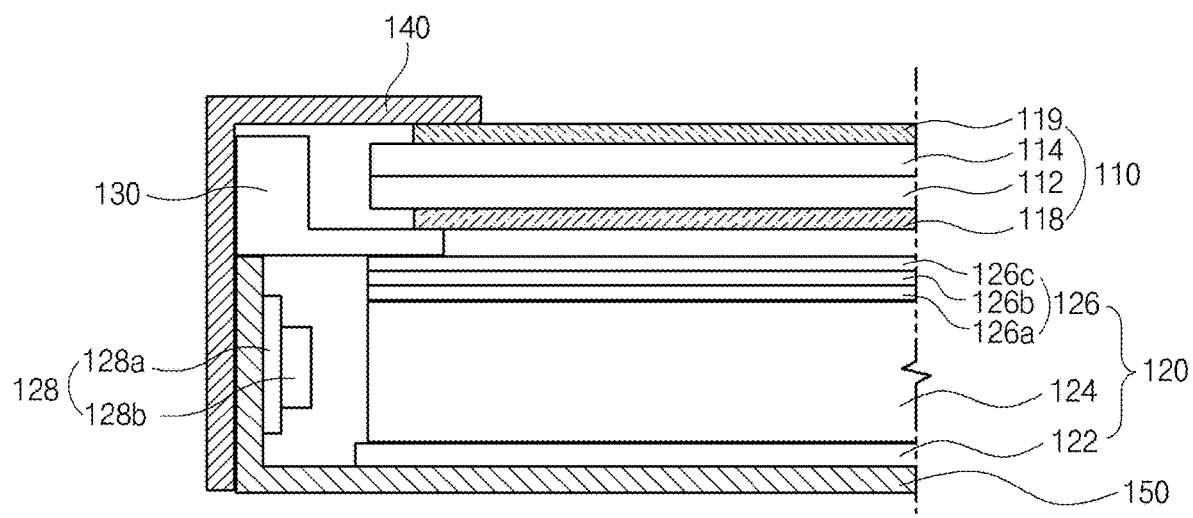
FIG. 4 is a cross-sectional view of an LCD device according to the first embodiment of the present invention.

FIG. 3 is a perspective view of an LCD device according to a first embodiment of the present invention, and FIG. 4 is a cross-sectional view of an LCD device according to the first embodiment of the present invention.

In FIGS. 3 and 4, the LCD device includes a liquid crystal panel 110, a backlight unit 120, a main frame 130, a top frame 140, and a bottom frame 150. The liquid crystal panel 110 displays an image and includes a first substrate 112, a second substrate 114, a liquid crystal layer (not shown), a first polarizer 118, and a second polarizer 119. The second substrate 114 is disposed over the first substrate 112, and the liquid crystal layer is interposed between the first and second substrates 112 and 114. The first and second polarizers 118 and 119 are disposed at outer surfaces of the first and second substrates 112 and 114, respectively.

Although not shown in the figures, the first substrate 112 may include a plurality of gate lines and a plurality of data lines on its inner surface. The gate lines and the data lines cross each other to define pixel regions. A thin film transistor and a pixel electrode are disposed at each pixel region. The thin film transistor is connected to each of the gate lines and the data lines, and the pixel electrode is connected to the thin film transistor. The first substrate 112 may be referred to as a lower substrate or an array substrate.

In addition, although not shown in the figures, the second substrate 114 may include a black matrix and a color filter layer on its inner surface. The black matrix has openings corresponding to the pixel regions, and the color filter layer includes red, green, and blue color filter patterns respectively corresponding to the openings and sequentially arranged. The second substrate 114 may be referred to as an upper substrate and a color filter substrate.

A common electrode is formed on the first substrate 112 or the second substrate 114. The common electrode and the pixel electrode constitute a liquid crystal capacitor with the liquid crystal layer interposed therebetween. For example, the common electrode may be formed in the pixel region of the first substrate 112. The common electrode and the pixel electrode may be patterned to have a rod shape and may be alternately arranged.

The first and second polarizers 118 and 119 are attached to the outer surfaces of the first and second substrates 112 and 114, respectively, and selectively transmit specific light. The first and second polarizers 118 and 119 transmit linearly-polarized light parallel to their light-transmission axes, respectively. The light-transmission axis of the first polarizer 118 is perpendicular to the light-transmission axis of the second polarizer 119.

Driver integrated circuits (driver ICs) 116 are attached to at least one side of the liquid crystal panel 110 through a connecting structure, such as tape carrier packages (TCPs), and the driver ICs 116 are connected to a printed circuit board (PCB) 117. The PCB 117 is bent during a modularization process and may be disposed at a side surface of the main frame 130 or at a rear surface of the bottom frame 150.

The backlight unit 120 may be disposed under the liquid crystal panel 110 to provide light to the liquid crystal panel 110. The backlight unit 120 may include a reflection sheet 122, a light guide plate 124, an optical sheet 126, and a light-emitting diode (LED) assembly 128.

The LED assembly 128, as a light source of the backlight unit 120, includes an LED printed circuit board 128a and a plurality of LED packages 128b. The LED packages 128b are mounted on a surface of the LED printed circuit board 128a and are disposed with a predetermined distance therebetween along a length of the LED printed circuit board 128a. As shown, the LED packages 128b are arranged in a line. Alternatively, the LED packages 128b may be arranged in two or more lines.

Each of the LED packages 128b according to this embodiment of the present invention includes a blue (B) LED chip, a yellow (Y) phosphor, and a red (R) phosphor and emits white light, and further includes a light absorption material absorbing light within a wavelength range between red and green as further described in detail herein.

The LED assembly 128 may be disposed at a side of the light guide plate 124. The LED assembly 128 may be disposed at a short side of the light guide plate 124. The light guide plate 124 reflects and refracts light, which is incident on its inside from the LED packages 128a through its side surface, and moves the light toward its front surface, thereby implementing a surface light source. The side surface of the light guide plate 124, through which the light is incident on the inside, may be referred to as a light-incident surface.

To provide a uniform surface light source, the light guide plate 124 may include predetermined patterns at its rear surface. For example, to guide the light incident on the inside of the light guide plate 124, the patterns may be elliptical patterns, polygonal patterns or hologram patterns. The patterns may be formed by a printing method or an injecting method.

The reflection sheet 122 is disposed under the rear surface of the light guide plate 124. The reflection sheet 122 reflects light passing through the rear surface of the light guide plate 124 toward the liquid crystal panel 110, thereby increasing the brightness.

The optical sheet 126 may be disposed over the light guide plate 124. The optical sheet 126 includes a diffusion sheet and at least a light-concentrating sheet. The optical sheet 126 diffuses or concentrates light passing through the light guide plate 124 such that more uniform surface light source is provided to the liquid crystal panel 110. The optical sheet 126 may include first, second and third optical sheets 126a, 126b, and 126c sequentially disposed over the light guide plate 124.

For instance, each of the first and second optical sheets 126a and 126b may be a light-concentrating sheet, and the third optical sheet 126c may be a diffusion sheet. The light-concentrating sheet may include prism patterns or lenticular patterns. The first optical sheet 126a may include lenticular patterns, and the second optical sheet 126b may include prism patterns.

The third optical sheet 126c may be a brightness enhancement film. The brightness enhancement film may include layers having different refractive indexes, which are alternately layered.

The liquid crystal panel 110 and the backlight unit 120 are modularized using the main frame 130, the top frame 140, and the bottom frame 150. The main frame 130 has a rectangular frame shape and includes a vertical portion and a horizontal portion. The liquid crystal panel 110 is disposed over the horizontal portion, and the backlight unit 120 is disposed under the horizontal portion. The vertical portion of the main frame 130 surrounds side surfaces of the liquid crystal panel 110.

The bottom frame 150 includes a horizontal surface on which the backlight unit 120 is disposed and side surfaces perpendicular to the horizontal surface. The LED assembly 128 is disposed on one of the side surfaces of the bottom frame 150.

The top frame 140 has a rectangular frame shape, and the top frame 140 has a cross-sectional surface of a reverse L-like shape to cover edges of a front surface and side surfaces of the liquid crystal panel 110. The top frame 140 includes an opening at the center of its front surface, and images produced by the liquid crystal panel 110 are displayed to the outside through the opening.

The top frame 140, the main frame 130, and the bottom frame 150 are assembled and combined with each other, thereby modularizing the LCD device. In some arrangements, the top frame 140 may be omitted.

The top frame 140 may be referred to as a case top, top case, or a top cover. The main frame 130 may be referred to as a guide panel or a main support. The bottom frame 150 may be referred to as a cover bottom or a bottom cover.

As stated above, the LCD device according to the first embodiment of the present invention includes the LED package 128b, which includes the blue (B) LED chip, the yellow (Y) phosphor, and the red (R) phosphor to thereby emit white light and further includes the light absorption material absorbing light within a wavelength range between red and green. Hereinafter, the LED package 128b will be described in more detail with reference to accompanying drawings.

Figure 5A:
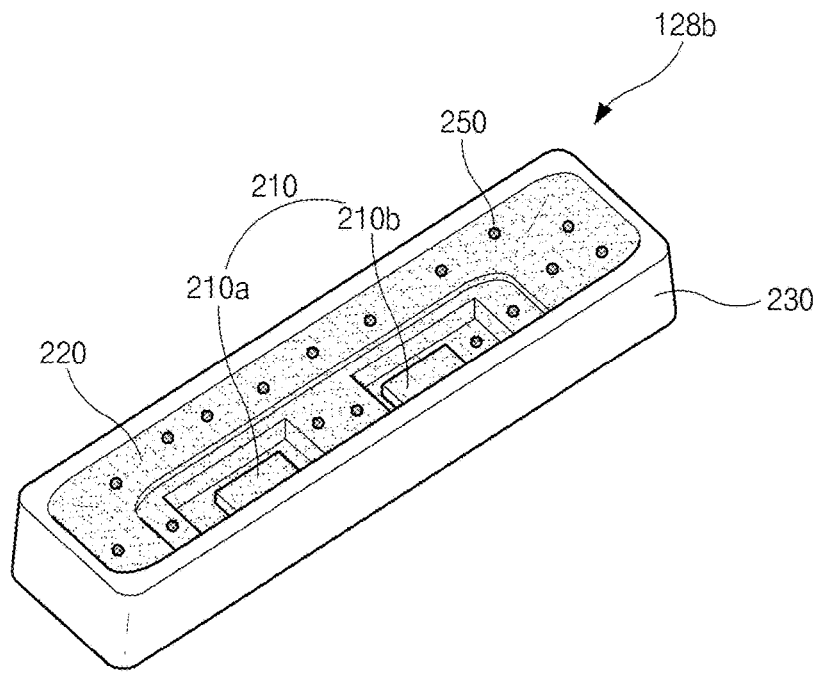
FIG. 5A is a perspective view illustrating an LED package according to the first embodiment of the present invention.
Figure 5B:
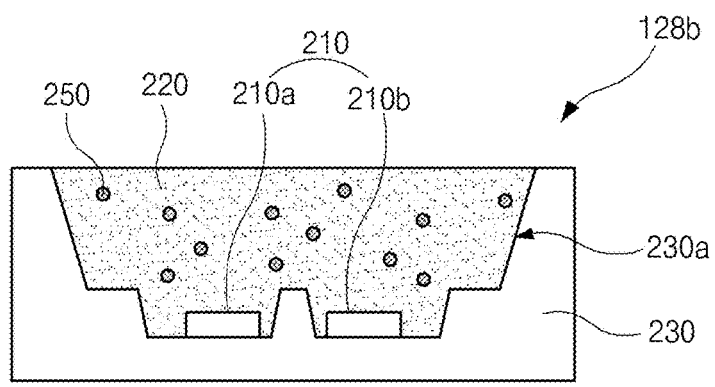
FIG. 5B is a cross-sectional view illustrating the LED package according to this embodiment of the present invention.

FIG. 5A is a perspective view illustrating an LED package according to the first embodiment of the present invention, and FIG. 5B is a cross-sectional view illustrating the LED package according to this embodiment of the present invention.

In FIGS. 5A and 5B, the LED package 128b includes an LED chip 210, a resin layer 220 containing phosphors (not shown) and a light absorption material 250, and a mold frame 230.

The LED chip 210 may include a first chip 210a and a second chip 210b. Each of the first and second chips 210a and 210b emits blue light and is electrically connected to the LED printed circuit board 128a of FIG. 3 through a wire bonding. The two chips 210a and 210b are used, and the number of chips is not limited to this example arrangement.

The mold frame 230 has a cavity inside. The first and second chips 210a and 210b are disposed in the cavity. More particularly, the first and second chips 210a and 210b are disposed on a bottom surface of the mold frame 230 corresponding to the cavity and are spaced apart from each other. A side surface of the mold frame 230 corresponding to the cavity has an inclined reflective surface 230a to send light from the first and second chips 210a and 210b upwards. The cavity may further include a dented portion corresponding to each of the first and second chips 210a and 210b.

Although not shown in the figures, the mold frame 230 may include a lower frame and an upper frame, which are separable, and a lead frame may be disposed between the lower frame and the upper frame. The lead frame may be connected to the first and second chips 210a and 210b and provide voltages such that recombination of an electron and a hole is generated in each of the first and second chips 210a and 210b.

The resin layer 220 containing phosphors and the light absorption material 250 is formed in the cavity and covers the first and second chips 210a and 210b. For instance, the phosphors and the light absorption material 250 may be dispersed in silicone resin. The phosphors may include a yellow (Y) phosphor and a red phosphor (R). The light absorption material 250 absorbs light within a wavelength range between red and green.

Each of the first and second chips 210a and 210b has a peak wavelength region of about 444 nm, the yellow (Y) phosphor has a peak wavelength region of about 540 nm, and the red (R) phosphor has a peak wavelength region of about 650 nm.

The LED package 128b according to the first embodiment of the present invention relatively decreases a blue intensity and relatively increases yellow and red intensities as compared with a related art LED package. To accomplish this, the total content of the yellow (Y) phosphor and the red (R) phosphor may be about 2.0 wt % to about 20 wt % of a content of the resin layer 220—for example, about 5.8 wt % of a content of the resin layer 220. At this time, it is desirable that the content of the yellow (Y) phosphor is larger than the content of the red (R) phosphor. The mixing ratio by weight of the yellow (Y) phosphor to the red (R) phosphor may be about 55:45.

The LED package 128b has an overlap region between red light and green light, and thus the color gamut of an LCD device including the LED package 128b is lowered. Accordingly, in the LCD device having the LED package 128b according to the first embodiment of the present invention, the resin layer 220 of the LED package 128b may include the light absorption material 250 absorbing light within a wavelength range between red and green, and the color gamut of the LCD device increases.

The light absorption material 250 may have an absorption peak in a wavelength region of 590 nm. For example, the light absorption material 250 includes a metal-coordination tetra-azaporphyrin compound expressed by the following chemical formula 1.

Chemical formula 1

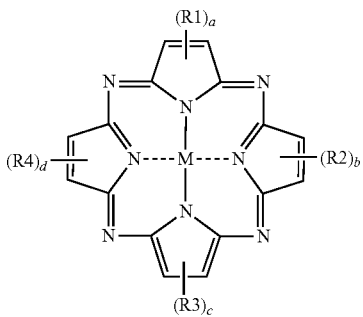

M is selected from Ni, Mg, Mn, Co, Cu, Ru and V. At least one ligand, which is selected from $NH_3$, $H_2O$ and a halogen atom, may be coordinated to any of Ni, Mg, Mn, Co, Cu, Ru, and V, of which particular embodiments may use Mn or Ru. In addition, each of R1, R2, R3, and R4 may be independently selected from a C1 to C10 alkyl group and a C6 to C30 aromatic group, and each of a, b, c and d may be 1 or 2. For example, a C1 to C10 alkyl group may include but is not limited to methyl, ethyl, propyl or butyl, and a C6 to C30 aromatic group may be, but is not limited to, phenyl.

The metal-coordination tetra-azaporphyrin compound may be present in an amount of 0.05 wt % to 0.15 wt % based on the resin layer 220. If the content of the metal-coordination tetra-azaporphyrin compound is larger than 0.15 wt %, the intensity of the absorption spectrum at the wavelength region of 590 nm increases, and the light absorption rate at the wavelength region of 590 nm also increases. Therefore, the color gamut increases, and the brightness decreases. In contrast, if the content of the metal-coordination tetra-azaporphyrin compound is smaller than 0.05 wt %, the intensity of the absorption spectrum at the wavelength region of 590 nm decreases, and the light absorption rate at the wavelength region of 590 nm also decreases. Therefore, the brightness increases, and the color gamut decreases. Thus, the metal-coordination tetra-azaporphyrin compound may be present in an amount of 0.08 wt % to 0.12 wt %—for example in an amount of about 0.1 wt % based on an acryl binder.

Figure 6A:
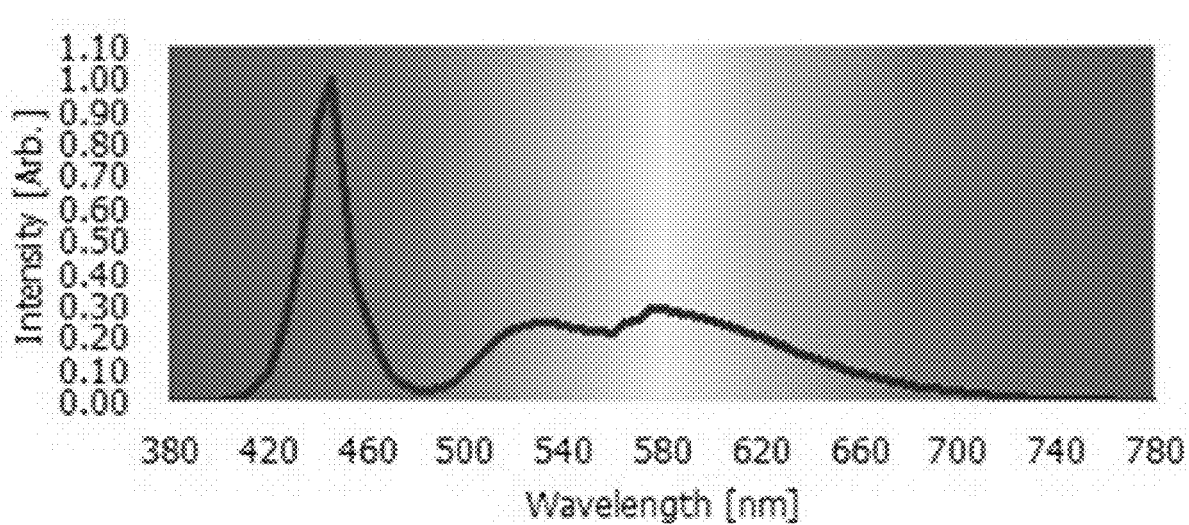
FIG. 6A illustrates an emission spectrum of a blue LED chip and yellow and red phosphors in an LED package of the LCD device according to the first embodiment of the present invention.
Figure 6B:
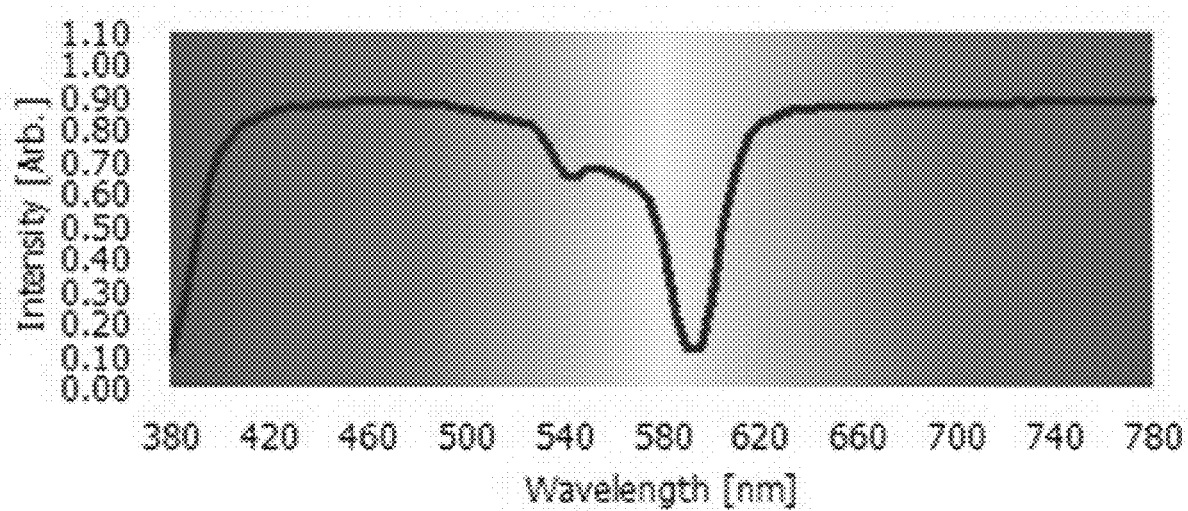
FIG. 6B illustrates an absorption spectrum of a light absorption material in the LED package of the LCD device according to the first embodiment of the present invention.
Figure 6C:
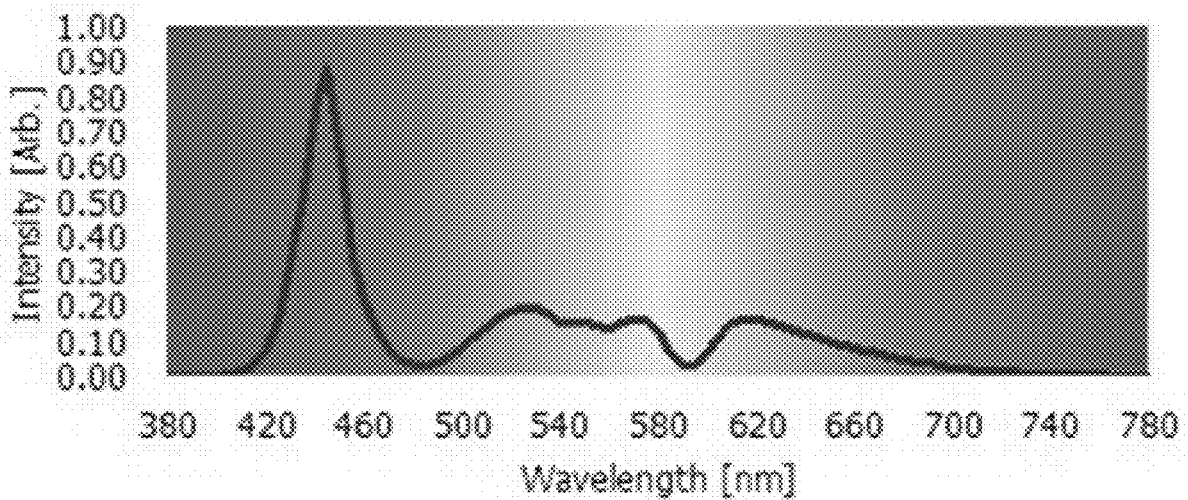
FIG. 6C is illustrates a spectrum of light emitted from the LED package of the LCD device according to the first embodiment of the present invention.

FIG. 6A illustrates an emission spectrum of a blue LED chip and yellow and red phosphors in an LED package of the LCD device according to the first embodiment of the present invention, FIG. 6B illustrates an absorption spectrum of a light absorption material in the LED package of the LCD device according to the first embodiment of the present invention, and FIG. 6C is illustrates a spectrum of light emitted from the LED package of the LCD device according to the first embodiment of the present invention.

In FIG. 6A, light emitted from the blue LED chip and the yellow and red phosphors in the LED package of the LCD device according to the first embodiment of the present invention has a blue peak wavelength, and there is an overlap region in a wavelength range between red and green. On the other hand, in FIG. 6B, the light absorption material in the LED package of the LCD device according to the first embodiment of the present invention has a strong absorption peak in a wavelength range between red and green. Therefore, when the LED package of the LCD device according to the first embodiment of the present invention emits light, as shown in FIG. 6C, the overlap region in the wavelength range between red and green can be removed, and pure red and green can be produced.

Figure 7:
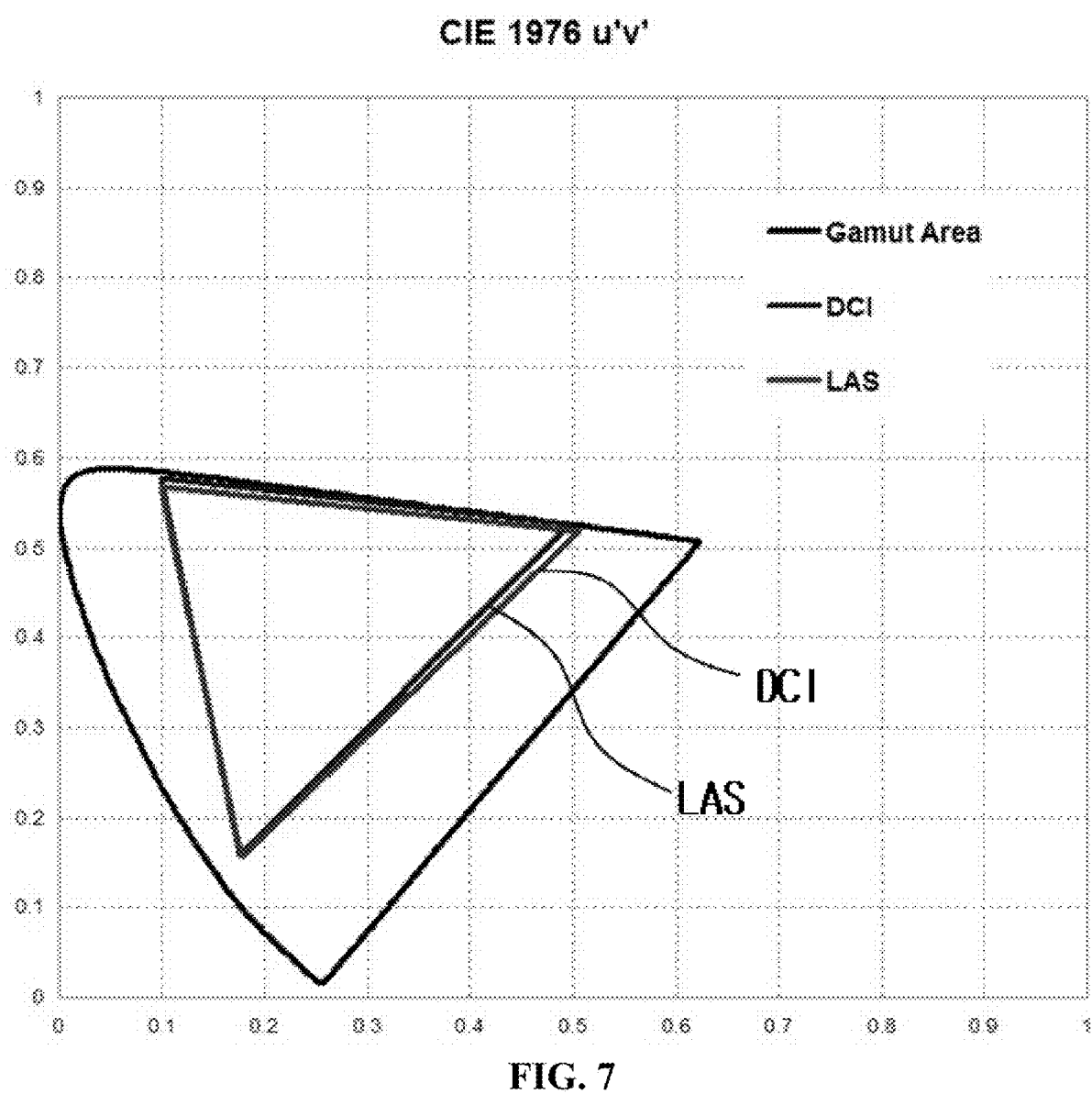
FIG. 7 is a view illustrating the color gamut of the LCD device according to the first embodiment of the present invention in a CIE 1976 chromaticity diagram.

The color gamut of the LCD device including the LED package is shown in FIG. 7. FIG. 7 is a view illustrating the color gamut of the LCD device according to the first embodiment of the present invention in a CIE (International Commission on Illumination) 1976 chromaticity diagram. FIG. 7 also shows the DCI (digital cinema initiative) color standard.

The CIE 1976 chromaticity diagram is chromaticity coordinates suggested to improve uniformity between a color matching interval on vision and a color matching interval on coordinates, which is a disadvantage of XYZ chromaticity coordinates, and shows human color perception with u' and v'. A similar distance on the CIE 1976 chromaticity diagram corresponds to a difference between colors similarly perceived.

In FIG. 7, an overlap ratio of the color gamut LAS of the LCD device according to the first embodiment of the present invention, which includes the LED package, to the DCI color standard is 95%, and the LCD device according to this embodiment of the present invention has a relatively wide color gamut.

The LCD device according to the first embodiment of the present invention can have a relatively wide color gamut at relatively low costs by controlling the total content and the mixing ratio of the yellow (Y) and red (R) phosphors of the LED package containing the blue (B) LED chip and by using the resin layer of the LED package that includes a light absorption material absorbing light within a wavelength range between red and green.

Meanwhile, a condition for white of an LCD device used for televisions requires color coordinates of (Wx, Wy)= (0.278, 0.288) and a color temperature of 10,000K in the CIE 1931 chromaticity diagram. The condition for white according to the DCI color standard can be satisfied within an error range of ±0.015 using the LED package according to the first embodiment of the present invention.

In addition, relative luminance efficiency of light emitted from an LED package including a light absorption material to light emitted from an LED package excluding a light absorption material is more than about 70%, and a decrease in brightness is relatively low. Thus, the power consumption is prevented from increasing.

Second Embodiment

Figure 8:
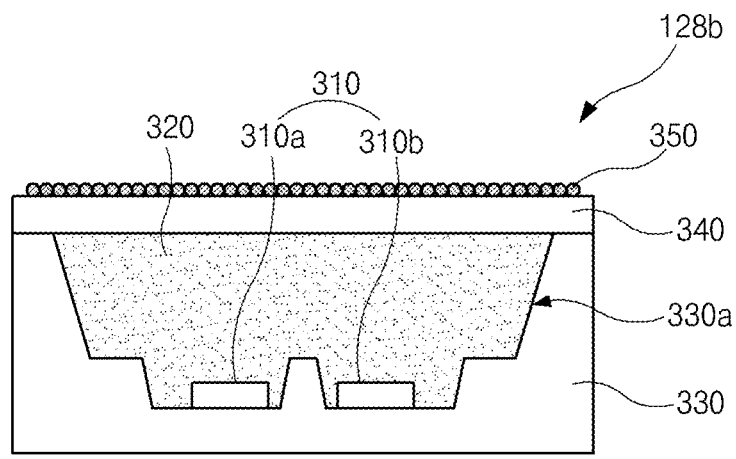
FIG. 8 is a cross-sectional view illustrating the LED package according to a second embodiment of the present invention.

FIG. 8 is a cross-sectional view illustrating the LED package according to a second embodiment of the present invention.

In FIG. 8, the LED package 128b includes an LED chip 310, a resin layer 320 containing phosphors (not shown), a mold frame 330, a transparent member 340, and a light absorption material 350.

The LED chip 310 may include a first chip 310a and a second chip 310b. Each of the first and second chips 310a and 310b emits blue light and is electrically connected to the LED printed circuit board 128a of FIG. 3 through a wire bonding. The two chips 310a and 310b are used, and the number of chips is not limited to this.

The mold frame 330 has a cavity inside. The first and second chips 310a and 310b are disposed in the cavity. More particularly, the first and second chips 310a and 310b are disposed on a bottom surface of the mold frame 330 corresponding to the cavity and are spaced apart from each other. A side surface of the mold frame 330 corresponding to the cavity has an inclined reflective surface 330a to send light from the first and second chips 310a and 310b upwards. The cavity may further include a dented portion corresponding to each of the first and second chips 310a and 310b.

Although not shown in the figures, the mold frame 330 may include a lower frame and an upper frame which are separable, and a lead frame may be disposed between the lower frame and the upper frame. The lead frame may be connected to the first and second chips 310a and 310b and provide voltages such that recombination of an electron and a hole is generated in each of the first and second chips 310a and 310b.

The resin layer 320 containing phosphors is formed in the cavity and covers the first and second chips 310a and 310b. For instance, the phosphors may be dispersed in silicone resin. The phosphors may include a yellow (Y) phosphor and a red phosphor (R).

The transparent member 340 is disposed over the resin layer 320 and the mold frame 330. The transparent member 340 may be formed of glass.

The light absorption material 350 absorbing light within a wavelength range between red and green is disposed on the transparent member 340. The light absorption material 350 may have an absorption peak in a wavelength region of 590 nm. For example, the light absorption material 350 includes a metal-coordination tetra-azaporphyrin compound expressed by the chemical formula 1.

The light absorption material 350 may be dispersed in a binder and may be coated on the transparent member 340. The binder may be an acryl compound.

Each of the first and second chips 310a and 310b has a peak wavelength region of about 444 nm, the yellow (Y) phosphor has a peak wavelength region of about 540 nm, and the red (R) phosphor has a peak wavelength region of about 650 nm.

The LED package 128b according to the second embodiment of the present invention relatively decreases a blue intensity and relatively increases yellow and red intensities as compared with a related art LED package. To accomplish this, the total content of the yellow (Y) phosphor and the red (R) phosphor may be about 2.0 wt % to about 20 wt % of a content of the resin layer 320, for example, about 5.8 wt % of a content of the resin layer 320. At this time, it is desirable that the content of the yellow (Y) phosphor is larger than the content of the red (R) phosphor. The mixing ratio by weight of the yellow (Y) phosphor to the red (R) phosphor may be about 55:45.

The LED package 128b has an overlap region between red light and green light, and thus the color gamut of an LCD device including the LED package 128b is lowered. Accordingly, in the LCD device having the LED package 128b according to the second embodiment of the present invention, the LED package 128b includes the light absorption material 350 absorbing light within a wavelength range between red and green, and the color gamut of the LCD device increases.

The light absorption material 350 is disposed on the transparent member 340 such that the light absorption material 350 is separated from the LED chip 310 disposed under the transparent member 340. In this case, the light absorption material 350 is prevented from being degraded by heat generated from the LED chip 310, and heat resistance can be obtained. The transparent member 340 may have a thickness equal to or less than about 0.5 mm considering transmittance and heat resistance.

Alternatively, the light absorption material 350 may be disposed under the transparent member 340. In this case, the light absorption material 350 can be prevented from being damaged by impacts from the outside.

In the LED package 128b of FIGS. 5A and 5B according to the first embodiment, because the light absorption material 250 is included in the resin layer 220 with the phosphors (not shown), the light absorbing property may be lowered a little. Namely, some light from the phosphors may not be absorbed by the light absorption material 250 at the specific wavelength range and then may be outputted by the LED package 128b. However, in the LED package 128b of FIG. 8 according to the second embodiment, because the light absorption material 350 is disposed over the resin layer 320, the above-mentioned problem does not occur.

The first and second embodiments of the present invention explain an LCD device including an edge-type backlight unit. However, the present invention can be applied to an LCD device including a direct-type backlight unit, and this will be described with reference to accompanying drawings.

Third Embodiment

Figure 9:
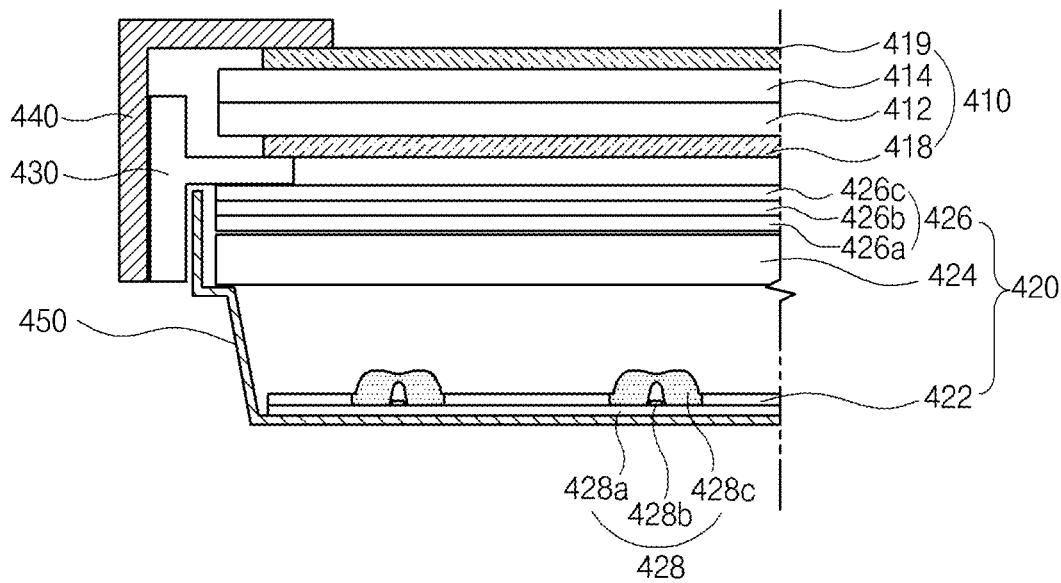
FIG. 9 is a cross-sectional view of an LCD device according to a third embodiment of the present invention.
Figure 10:
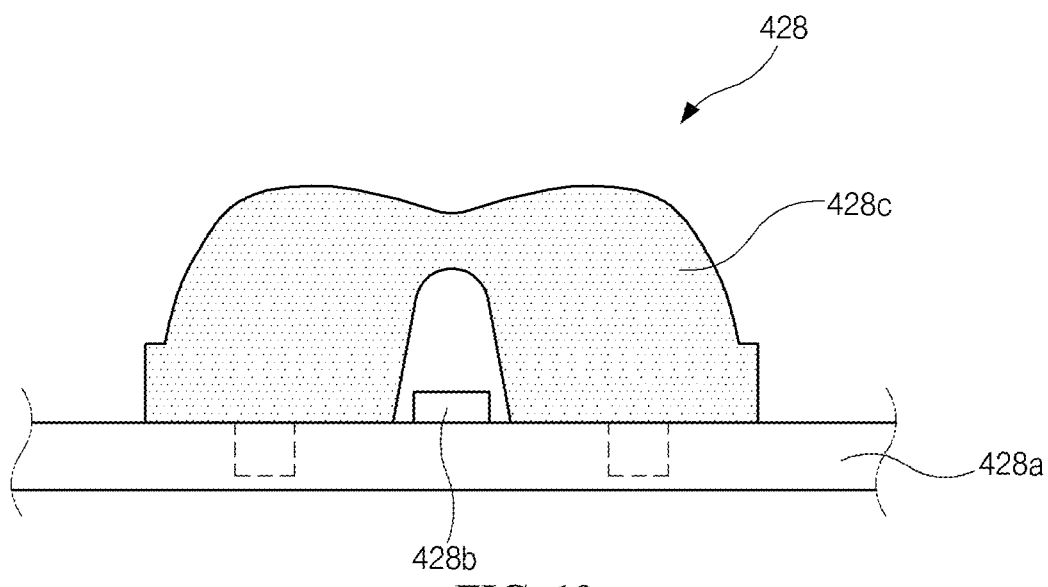
FIG. 10 is a cross-sectional view of enlarging an LED assembly of the LCD device according to the third embodiment of the present invention.

FIG. 9 is a cross-sectional view of an LCD device according to a third embodiment of the present invention, and FIG. 10 is a cross-sectional view of enlarging an LED assembly of the LCD device according to the third embodiment of the present invention.

In FIG. 9, the LCD device includes a liquid crystal panel 410, a backlight unit 420, a main frame 430, a top frame 440, and a bottom frame 450. The liquid crystal panel 410 displays an image and includes a first substrate 412, a second substrate 414, a liquid crystal layer (not shown), a first polarizer 418, and a second polarizer 419. The second substrate 414 is disposed over the first substrate 412, and the liquid crystal layer is interposed between the first and second substrates 412 and 414. The first and second polarizers 418 and 419 are disposed at outer surfaces of the first and second substrates 412 and 414, respectively.

Although not shown in the figure, the first substrate 412 includes a plurality of gate lines and a plurality of data lines on its inner surface. The gate lines and the data lines cross each other to define pixel regions. A thin film transistor and a pixel electrode are disposed at each pixel region. The thin film transistor is connected to each of the gate lines and the data lines, and the pixel electrode is connected to the thin film transistor. The first substrate 412 may be referred to as a lower substrate or an array substrate.

In addition, although not shown in the figure, the second substrate 414 includes a black matrix and a color filter layer on its inner surface. The black matrix has openings corresponding to the pixel regions, and the color filter layer includes red, green and blue color filter patterns respectively corresponding to the openings and sequentially arranged. The second substrate 414 may be referred to as an upper substrate and a color filter substrate.

A common electrode is formed on the first substrate 412 or the second substrate 414. The common electrode and the pixel electrode constitute a liquid crystal capacitor with the liquid crystal layer interposed therebetween. For example, the common electrode may be formed in the pixel region of the first substrate 412. The common electrode and the pixel electrode may be patterned to have a rod shape and may be alternately arranged.

The first and second polarizers 418 and 419 are attached to the outer surfaces of the first and second substrates 412 and 414, respectively, and selectively transmit specific light. The first and second polarizers 418 and 419 transmit linearly-polarized light parallel to their light-transmission axes, respectively. The light-transmission axis of the first polarizer 418 is perpendicular to the light-transmission axis of the second polarizer 419.

The backlight unit 420 is disposed under the liquid crystal panel 410, and the backlight unit 420 provides light to the liquid crystal panel 410. The backlight unit 420 includes a reflection sheet 422, a light guide plate 424, an optical sheet 426, and an LED assembly 428.

The LED assembly 428 includes an LED printed circuit board 428a, a plurality of LED packages 428b, and a plurality of lenses 428c respectively corresponding to the LED packages 428b. The LED packages 428b and the lenses 428c are mounted on a surface of the LED printed circuit board 428a and are disposed with a predetermined distance therebetween along a length of the LED printed circuit board 428a. As shown, the LED packages 428b and the lenses 428c are arranged in a line. Alternatively, the LED packages 428b and the lenses 428c may be arranged in two or more lines. Although not shown in the figure, the LED assembly 428 may include a plurality of LED printed circuit boards 428a disposed on the bottom frame 450 side by side, and a plurality of LED packages 428b and a plurality of lenses 428c may be mounted on each of the LED printed circuit boards 428a.

As shown in FIG. 10, the LED package 428b may be mounted on an upper surface of the LED printed circuit board 428a, and the lenses 428c is disposed over the LED package 428b to cover the LED package 428b. The LED printed circuit board 428a applies voltages to the LED package 428b, and the LED package 428b emits light due to the applied voltages. The light emitted from the LED package 428b is outputted through the lens 428c.

The LED package 428b according to the third embodiment of the present invention includes a blue (B) LED chip, a yellow (Y) phosphor, and a red (R) phosphor and emits white light, and further includes a light absorption material absorbing light within a wavelength range between red and green as further described in detail herein.

The lens 428c has an inner space, and the LED package 428b is disposed in the inner space of the lens 428c. The lens 428c includes inner and outer surfaces which have predetermined curves such that light from the LED package 428b is diffused. The lens 428c may be formed of poly(methyl methacrylate) (PMMA) or polycarbonate (PC).

With further reference to FIG. 9, the reflection sheet 422 is disposed on the LED printed circuit board 428a exposed between adjacent LED packages 428b. The reflection sheet 422 reflects light going to the bottom frame 450 from the LED packages 428b toward the liquid crystal panel 410 to increase the brightness.

A diffusion plate 424 is disposed over the LED assembly 428 and the reflection sheet 422 with a predetermined distance therefrom. The diffusion plate 420 uniformly diffuses light from the LED packages 428b.

The optical sheet 426 is disposed over the diffusion plate 424. The optical sheet 426 includes a diffusion sheet and at least a light-concentrating sheet. The optical sheet 426 diffuses or concentrates light passing through the light guide plate 424 such that more uniform surface light source is provided to the liquid crystal panel 410. The optical sheet 426 may include first, second and third optical sheets 426a, 426b, and 426c sequentially disposed over the diffusion plate 424.

For instance, each of the first and second optical sheets 426a and 426b may be a light-concentrating sheet, and the third optical sheet 426c may be a diffusion sheet. The light-concentrating sheet may include prism patterns or lenticular patterns. The first optical sheet 426a may include lenticular patterns, and the second optical sheet 426b may include prism patterns.

The third optical sheet 426c may be a brightness enhancement film. The brightness enhancement film may include layers having different refractive indexes, which are alternately layered.

The liquid crystal panel 410 and the backlight unit 420 are modularized with the main frame 430, the top frame 440, and the bottom frame 450.

The main frame 430 has a rectangular frame shape and includes a vertical portion and a horizontal portion. The liquid crystal panel 410 is disposed over the horizontal portion, and the backlight unit 420 is disposed under the horizontal portion. The vertical portion of the main frame 430 surrounds side surfaces of the liquid crystal panel 410.

The bottom frame 450 includes a horizontal surface and side surfaces perpendicular to the horizontal surface. The backlight unit 420 is disposed on the horizontal surface of the bottom frame 450, and the side surfaces of the bottom frame 450 surround the backlight unit 420. One end of at least one side surface may be disposed between the main frame 430 and the backlight unit 420.

The top frame 440 has a rectangular frame shape, and the top frame 440 has a cross-sectional surface of a reverse L-like shape to cover edges of a front surface and side surfaces of the liquid crystal panel 410. The top frame 440 includes an opening at the center of its front surface, and images produced by the liquid crystal panel 410 are displayed to the outside through the opening.

The top frame 440, the main frame 430, and the bottom frame 450 are assembled and combined with each other, thereby modularizing the LCD device. In some arrangements, the top frame 440 may be omitted.

The top frame 440 may be referred to as a case top, top case, or a top cover. The main frame 430 may be referred to as a guide panel or a main support. The bottom frame 450 may be referred to as a cover bottom or a bottom cover.

As stated above, the LCD device according to the third embodiment of the present invention includes the LED package 428b, which includes the blue (B) LED chip, the yellow (Y) phosphor, and the red (R) phosphor, thereby emitting white light, and further includes the light absorption material absorbing light within a wavelength range between red and green. Hereinafter, the LED package 428b will be described in more detail with reference to accompanying drawings.

Figure 11A:
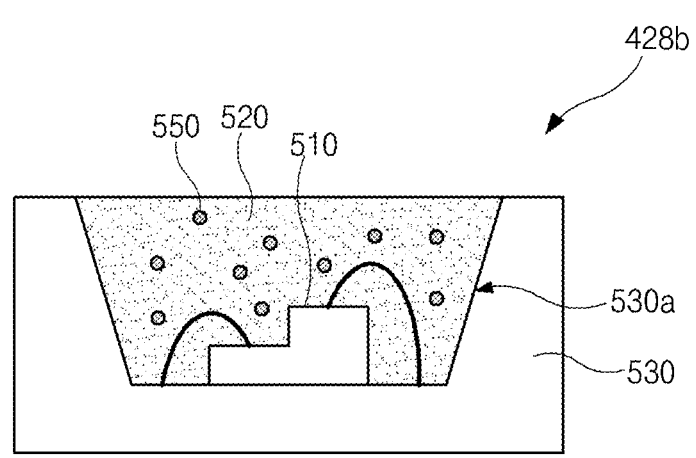
FIG. 11A is a cross-sectional view illustrating a structure of the LED package according to the third embodiment of the present invention.
Figure 11B:
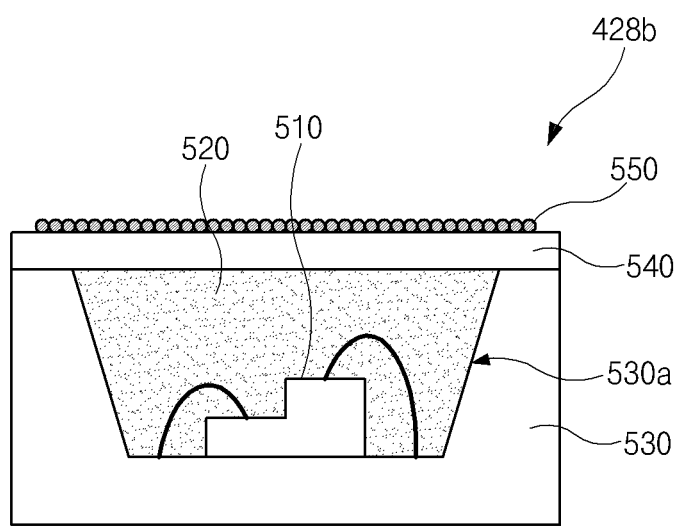
FIG. 11B is a cross-sectional view illustrating another structure of the LED package according to the third embodiment of the present invention.

FIG. 11A is a cross-sectional view illustrating a structure of the LED package according to the third embodiment of the present invention, and FIG. 11B is a cross-sectional view illustrating another structure of the LED package according to the third embodiment of the present invention.

In FIGS. 11A and 11B, the LED package 428b includes an LED chip 510, a resin layer 520 containing phosphors (not shown), a mold frame 530, and a light absorption material 550.

The LED chip 510 emits blue light and is electrically connected to the LED printed circuit board 428a of FIG. 10 through a wire bonding. The single chip 510 is used, and the number of chips is not limited to this.

The mold frame 530 has a cavity inside. The LED chip 510 is disposed in the cavity. More particularly, the LED chip 510 is disposed on a bottom surface of the mold frame 530 corresponding to the cavity. A side surface of the mold frame 530 corresponding to the cavity has an inclined reflective surface 530a to send light from the LED chip 510 upwards. The cavity may further include a dented portion corresponding to the LED chip 510.

Although not shown in the figures, the mold frame 530 may include a lower frame and an upper frame which are separable, and a lead frame may be disposed between the lower frame and the upper frame. The lead frame may be connected to the LED chip 510 and provide voltages such that recombination of an electron and a hole is generated in the LED chip 510.

The resin layer 520 containing phosphors is formed in the cavity and covers the LED chip 510. For instance, the phosphors may be dispersed in silicone resin. The phosphors may include a yellow (Y) phosphor and a red phosphor (R).

The LED chip 510 has a peak wavelength region of about 444 nm, the yellow (Y) phosphor has a peak wavelength region of about 540 nm, and the red (R) phosphor has a peak wavelength region of about 650 nm.

The LED package 428b according to the third embodiment of the present invention relatively decreases a blue intensity and relatively increases yellow and red intensities as compared with a related art LED package. To accomplish this, the total content of the yellow (Y) phosphor and the red (R) phosphor may be about 2.0 wt % to about 20 wt % of a content of the resin layer 520—for example, about 5.8 wt % of a content of the resin layer 520. At this time, it is desirable that the content of the yellow (Y) phosphor is larger than the content of the red (R) phosphor. The mixing ratio by weight of the yellow (Y) phosphor to the red (R) phosphor may be about 55:45.

The LED package 428b has an overlap region between red light and green light, and thus the color gamut of an LCD device including the LED package 428b is lowered.

Accordingly, in the LCD device having the LED package 428b according to the third embodiment of the present invention, the LED package 428b includes the light absorption material 550 absorbing light within a wavelength range between red and green, and the color gamut of the LCD device increases.

At this time, as shown in FIG. 11A, the light absorption material 550 may be present in the resin layer 520. Alternatively, as shown in FIG. 11B, the light absorption material 550 may be disposed on the resin layer 520.

The light absorption material 550 may have an absorption peak in a wavelength region of 590 nm. For example, the light absorption material 550 includes a metal-coordination tetra-azaporphyrin compound expressed by the chemical formula 1.

Meanwhile, the LED package 428b of FIG. 11B may further include a transparent member 540 between the resin layer 520 and the light absorption material 550. The transparent member 540 may be formed of glass. The light absorption material 550 may be dispersed in a binder and may be coated on the transparent member 540. The binder may be an acryl compound.

In the LED package 428b of FIG. 11B, the light absorption material 550 is disposed on the transparent member 540 such that the light absorption material 550 is separated from the LED chip 510 disposed under the transparent member 540. In this case, the light absorption material 550 is prevented from being degraded by heat generated from the LED chip 510, and heat resistance can be obtained. The transparent member 540 may have a thickness equal to or less than about 0.5 mm considering transmittance and heat resistance.

Alternatively, the light absorption material 550 may be disposed under the transparent member 540. In this case, the light absorption material 550 can be prevented from being damaged by impacts from the outside.

In the LED package 428b of FIG. 11A, because the light absorption material 550 is included in the resin layer 520 with the phosphors (not shown), the light absorbing property may be lowered a little. Namely, some of light from the phosphors may not be absorbed by the light absorption material 550 at the specific wavelength range and then may be outputted by the LED package 428b. However, in the LED package 428b of FIG. 11B, because the light absorption material 550 is disposed over the resin layer 520, the above-mentioned problem does not occur.

The LCD device including a direct-type backlight unit according to the third embodiment of the present invention can have a relatively wide color gamut at relatively low costs by controlling the total content and the mixing ratio of the yellow (Y) and red (R) phosphors of the LED package containing the blue (B) LED chip and using the LED package that includes a light absorption material absorbing light within a wavelength range between red and green.

In accordance with example configurations of the present invention, by adjusting the total content and the mixing ratio of the yellow and red phosphors of the LED package containing the blue LED chip and adding the light absorption material absorbing light within a wavelength range between red and green to the LED package, a change in components can be minimized, and the LCD device having the wide color gamut can be achieved in a simple way.

Further, the LED package including the light absorption material can be formed at relatively low costs. An increase in the manufacturing costs of the LCD device is minimized, and the resultant LCD device has a competitive price.

In addition, the light absorption material can be disposed at one of various positions, such as inside the resin layer of the LED package or over the resin layer, and the degree of design can be increased. When the light absorption material is disposed over the resin layer, the heat resistance can be improved.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:
1. A liquid crystal display device, comprising:
    a liquid crystal panel; and
    a backlight unit under the liquid crystal panel and having a light source including:
        a first luminous material having a first peak wavelength,
        a second luminous material having a second peak wavelength greater than the first peak wavelength,
        a third luminous material having a third peak wavelength greater than the second peak wavelength, and
        a light absorption material having an absorption maximum at a wavelength between the second peak wavelength and the third peak wavelength,
    wherein the first luminous material is disposed in a light emitting diode chip, the second luminous material comprises a first phosphor, and the third luminous material comprises a second phosphor,
    wherein the light source further includes a resin layer in which the first and second phosphors are dispersed,
    wherein the light absorption material is disposed over the resin layer to reduce degradation of the light absorption material by heat generated by the light emitting diode chip,
    wherein the light source further includes a transparent member over the resin layer, and the transparent member is in direct contact with the resin layer,
    wherein the light absorption material is coated on and in direct contact with the transparent member,
    wherein the resin layer and the light absorption material are on opposite sides of the transparent member, and
    wherein the light absorption material includes a metal-coordination tetra-azaporphyrin compound of chemical formula:

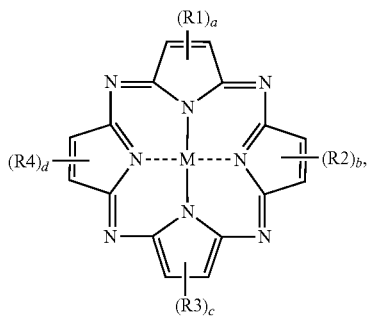

wherein:
    M is selected from the group consisting of Ni, Mg, Mn, Co, Cu, Ru, and V to which at least one ligand selected from the group consisting of $NH_3$, $H_2O$, and a halogen atom is coordinated;
    each of R1, R2, R3, and R4 is independently selected from the group consisting of a C1 to C10 alkyl group and a C6 to C30 aromatic group; and
    each of a, b, c and d is 1 or 2.

2. The liquid crystal display device of claim 1, wherein a mixing ratio by weight of the first phosphor to the second phosphor is 55:45.

3. The liquid crystal display device of claim 2, wherein the first and second phosphors are present in a total amount of 2.0 wt % to 20 wt % of a content of the resin layer.

4. The liquid crystal display device of claim 1, wherein the light emitting diode chip is a blue light emitting diode chip, the first phosphor is a yellow phosphor, and the second phosphor is a red phosphor.

5. The liquid crystal display device of claim 1, wherein the light absorption material is not included in the resin layer.

6. The liquid crystal display device of claim 1, wherein:
    the light absorption material is dispersed in a binder and coated on the transparent member; and
    the binder is an acryl compound.

7. The liquid crystal display device of claim 1, wherein the first peak wavelength is 444 nm, the second peak wavelength is 540 nm, and the third peak wavelength is 650 nm.

8. The liquid crystal display device of claim 1, wherein the transparent member is in direct physical contact with the resin layer.

9. The liquid crystal display device of claim 1, wherein the transparent member has a thickness equal to or less than 0.5 mm.

10. The liquid crystal display device of claim 1, wherein the backlight unit further includes a light guide plate between the light source and the liquid crystal panel, and the light absorption material is disposed between the transparent member and the light guide plate.

11. A backlight unit, comprising:
    a light source, and
    an optical sheet over the light source,
    wherein the light source includes:
        a first luminous material having a first peak wavelength,
        a second luminous material having a second peak wavelength greater than the first peak wavelength,
        a third luminous material having a third peak wavelength greater than the second peak wavelength, and
        a light absorption material having an absorption maximum at a wavelength between the second peak wavelength and the third peak wavelength,
    wherein the first luminous material is disposed in a light emitting diode chip,
    wherein the light source further includes a resin layer in which the second luminous material and the third luminous material are dispersed,
    wherein the light absorption material is disposed over the resin layer to reduce degradation of the light absorption material by heat generated by the light emitting diode chip,
    wherein the light source further includes a transparent member over the resin layer, and the transparent member is in direct physical contact with the resin layer and the light absorption material,
    wherein the resin layer and the light absorption material are on opposite sides of the transparent member, and
    wherein the light absorption material includes a metal-coordination tetra-azaporphyrin compound of chemical formula:

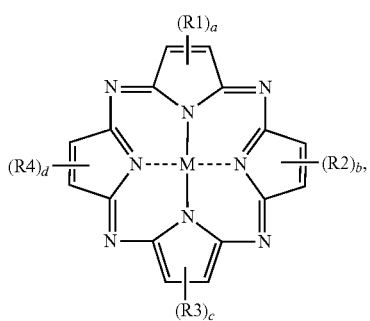

wherein:

M is selected from the group consisting of Ni, Mg, Mn, Co, Cu, Ru, and V to which at least one ligand selected from the group consisting of $NH_3$, $H_2O$, and a halogen atom is coordinated;

each of R1, R2, R3, and R4 is independently selected from the group consisting of a C1 to C10 alkyl group and a C6 to C30 aromatic group; and each of a, b, c and d is 1 or 2.

12. The backlight unit of claim 11, further comprising a lens covering the light source.

13. The backlight unit of claim 11, wherein the light absorption material is not included in the resin layer.

14. The backlight unit of claim 11, wherein:
the light absorption material is dispersed in a binder and coated on the transparent member; and
the binder is an acryl compound.

15. The backlight unit of claim 11, wherein the first peak wavelength is 444 nm, the second peak wavelength is 540 nm, and the third peak wavelength is 650 nm.

16. The backlight unit of claim 11, wherein the transparent member has a thickness equal to or less than 0.5 mm.

17. The backlight unit of claim 11, further comprising a light guide plate between the light source and the optical sheet, and the light absorption material is disposed between the transparent member and the light guide plate.

* * * * *